US012685195B2

(12) United States Patent
Chen et al.

(10) Patent No.:  US 12,685,195 B2
(45) Date of Patent:     Jul. 14, 2026

(54) SUBSTRATE, PACKAGED STRUCTURE, AND ELECTRONIC DEVICE

(71) Applicant: HUAWEI TECHNOLOGIES CO., LTD., Guangdong (CN)

(72) Inventors: Huibin Chen, Shanghai (CN); Yongzhao Lin, Dongguan (CN); Zhen Lv, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 636 days.

(21) Appl. No.: 18/189,622

(22) Filed: Mar. 24, 2023

(65) Prior Publication Data

US 2023/0230928 A1     Jul. 20, 2023

Related U.S. Application Data

(63) Continuation of application No. PCT/CN2020/117884, filed on Sep. 25, 2020.

(51) Int. Cl.
*H10W 70/65*      (2026.01)
*H10W 70/60*      (2026.01)
*H10W 70/685*     (2026.01)
*H10W 90/00*      (2026.01)

(52) U.S. Cl.
CPC .......... *H10W 70/65* (2026.01); *H10W 70/611* (2026.01); *H10W 70/685* (2026.01); *H10W 90/755* (2026.01)

(58) Field of Classification Search
CPC ........... H01L 23/49838; H01L 23/3107; H01L 23/49822; H01L 23/49866; H01L 23/3128; H01L 23/49816; H01L 23/5389; H01L 24/08; H01L 2224/08235; H01L 2924/3511; H01L 21/6835; H01L 2221/68345
See application file for complete search history.

(56) References Cited

U.S. PATENT DOCUMENTS

| | | | | |
|---|---|---|---|---|
| 2004/0238942 | A1* | 12/2004 | Chakravorty | .......... H05K 1/162 |
| | | | | 257/E23.079 |
| 2017/0018468 | A1* | 1/2017 | Gong | .................... H01L 21/486 |
| 2018/0022220 | A1 | 1/2018 | Xu et al. | |
| 2019/0370425 | A1* | 12/2019 | Chhabra | ................. H10D 1/68 |

FOREIGN PATENT DOCUMENTS

| | | |
|---|---|---|
| CN | 103152979 A | 6/2013 |
| CN | 205093042 U | 3/2016 |
| DE | 102007036841 B4 | 5/2018 |
| JP | 2000133768 A | 5/2000 |
| JP | 2001148458 A | 5/2001 |

* cited by examiner

*Primary Examiner* — Marlon T Fletcher
*Assistant Examiner* — Christina A Sylvia

(57) ABSTRACT

A substrate, a packaged structure, and an electronic device are provided. The substrate is configured to be electrically connected to a chip. The chip includes a power terminal and a signal terminal. The substrate includes a first substrate and a second substrate mounted on the first substrate. The first substrate includes a first layout, and the first layout is configured to be electrically connected to the power terminal. The second substrate includes a second layout, and the second layout is configured to be electrically connected to the signal terminal. A spacing between lines of the second layout is less than a spacing between lines of the first layout. The substrate provided in this application has a small size and high integration.

14 Claims, 8 Drawing Sheets

SUBSTRATE, PACKAGED STRUCTURE, AND ELECTRONIC DEVICE

CROSS-REFERENCE TO RELATED APPLICATIONS

This application is a continuation of International Application No. PCT/CN2020/117884, filed on Sep. 25, 2020, the disclosure of which is hereby incorporated by reference in its entirety.

TECHNICAL FIELD

This application relates to the field of electronic technologies, and in particular, to a substrate, a packaged structure, and an electronic device.

BACKGROUND

Metal substrates are widely used in packaging of high-power modules, such as a double-sided copper clad direct bond ceramic (DBC) board, an active metal brazing (AMB) ceramic board, and a double-sided direct bond aluminum (DBA) ceramic board. A metal substrate has good heat dissipation performance and a high through-current capability. In a package body, a metal substrate connects internal and external circuits, provides mechanical support, and provides an electrical insulation function. However, a size of an existing metal substrate is large.

SUMMARY

Embodiments of this disclosure provide a substrate, a packaged structure including the substrate, and an electronic device including the packaged structure, to achieve high electrical performance while obtaining a substrate and a packaged structure with a small size and high integration, and an electronic device with a small size.

According to a first aspect, an embodiment of this disclosure provides a substrate, configured to be electrically connected to a chip. The chip includes a power terminal and a signal terminal. The substrate includes a first substrate and a second substrate mounted on the first substrate. The first substrate includes a first layout, and the first layout is configured to be electrically connected to the power terminal. The second substrate includes a second layout, and the second layout is configured to be electrically connected to the signal terminal. A spacing between lines of the second layout is less than a spacing between lines of the first layout.

The substrate in this disclosure includes the first substrate and the second substrate. The first layout (a power line) configured to be connected to the power terminal of the chip is formed on the first substrate, and the second layout (a signal line) configured to be connected to the signal terminal of the chip is formed on the second substrate, that is, the power line and the signal line are respectively disposed on two different boards. Compared with a solution in which the power line and the signal line are integrated into one board, the spacing between the lines of the second layout may be less than the spacing between the lines of the first layout, thereby facilitating miniaturization of the substrate, and further improving integration of a packaged structure, reducing production costs, and saving internal space of an electronic device.

In some embodiments, the first substrate includes a first metal layer, the first layout is formed on the first metal layer, the second substrate includes a second metal layer, the second layout is formed on the second metal layer, and a thickness of the second metal layer is less than a thickness of the first metal layer, to ensure that the spacing between the lines of the second layout formed on the second metal layer can be less than the spacing between the lines of the first layout. Therefore, the lines of the second layout are denser, thereby helping reduce a size of the second substrate, implementing miniaturization of the substrate, and improving integration of the packaged structure. Certainly, in another embodiment, the thickness of the second metal layer may be greater than or equal to the thickness of the first metal layer, provided that the spacing between the lines of the second layout formed on the second metal layer is less than the spacing between the lines of the first layout formed on the first metal layer.

In some embodiments, the thickness of the second metal layer is 0.035 mm to 2 mm. The thickness of the second metal layer is limited to 0.035 mm to 2 mm, thereby ensuring that the second metal layer is sufficiently thin. Therefore, when the second layout is formed on the second metal layer, the spacing between the lines of the second layout can be sufficiently small, that is, it is ensured that the second metal layer can be etched at high density, so that the lines of the second layout can be denser, thereby helping reduce a size of the second substrate, implementing miniaturization of the substrate, and improving integration of the packaged structure.

In some embodiments, a spacing between two adjacent lines of the lines of the second layout is 0.1 mm to 0.5 mm. The spacing between two adjacent lines of the lines of the second layout is limited to 0.1 mm to 0.5 mm, thereby ensuring that the spacing between the lines of the second layout is sufficiently small. Therefore, it is ensured that the lines of the second layout can be sufficiently dense, thereby further reducing a size of the second substrate, implementing miniaturization of the substrate, and improving integration of the packaged structure.

In some embodiments, the first metal layer includes an avoidance groove, and the second substrate is at least partially embedded in the avoidance groove. That is, in this embodiment, the second substrate is at least partially embedded in the first substrate, thereby further reducing a size of the substrate in a thickness direction and improving integration of the substrate while reducing a planar size of the substrate.

In some embodiments, the first substrate includes a bearing plate, the first metal layer is disposed on the bearing plate, and a surface, of the second layout, that backs the bearing plate is flush with a surface, of the first metal layer, that backs the bearing plate. That is, a surface of the second layout is flush with a surface of the first layout. Therefore, when the chip is disposed on the substrate, the chip may be bonded to the substrate through flip chip bonding. A part, of the chip, that has the power terminal may be disposed on the first substrate and electrically connected to the first layout, and a part, of the chip, that has the signal terminal is disposed on the second substrate and electrically connected to the second layout, thereby preventing the signal terminal from being connected to the second layout through a wire. This simplifies a manufacturing step of the packaged structure, and improves production efficiency of the packaged structure.

In some embodiments, the second substrate further includes an insulation plate, the second layout is disposed on the insulation plate, and a side, of the insulation plate, that backs the second layout is connected to a surface of the first layout. The second substrate is mounted on the first substrate, thereby helping reduce a planar area of the entire substrate, and improving integration of the substrate and the packaged structure.

In some embodiments, the second substrate includes an insulation plate, the second layout is disposed on the insulation plate, the first substrate includes a bearing plate, the first layout is disposed on the bearing plate, a side edge of the insulation plate is connected to a side edge of the bearing plate, and the first layout is spaced from the second layout. Compared with welding the second substrate to a surface of the first metal layer, an area of a solder side on which the side edge of the insulation plate is connected to the side edge of the bearing plate is smaller, and corresponding process costs are reduced. In addition, the insulation plate can be welded to any side edge of the bearing plate, so that a design is more flexible.

In some embodiments, the first substrate further includes a third metal layer, and the third metal layer is disposed on a surface, of the bearing plate, that backs the first layout. The third metal layer is made of a copper material. Certainly, the third metal layer may be alternatively made of another metal material such as aluminum or nickel, or a non-metal material. The third metal layer is configured to transfer, to the outside, heat transferred by the chip to the first layout, so that heat dissipation of the chip is faster, thereby ensuring electrical performance of the chip. In addition, the third metal layer can further enhance strength of the entire substrate.

In some embodiments, the second substrate further includes a fourth metal layer, and the fourth metal layer is disposed on a surface, of the insulation plate, that backs the second layout. The fourth metal layer is configured to transfer, to the outside, heat transferred by the chip to the first layout, so that heat dissipation of the chip is faster, thereby ensuring electrical performance of the chip. In addition, the fourth metal layer can further enhance strength of the second substrate.

In some embodiments, there are a plurality of second substrates, and the plurality of second substrates are mounted on the first substrate at spacings, and are respectively disposed close to the chips electrically connected to the plurality of second substrates. This is equivalent to separately disposing, on two boards, the second layout disposed on one board, so that the second substrate can be made smaller. In addition, the two second substrates may be separately disposed at different locations based on chips electrically connected to the two second substrates, so that a layout is more flexible, and stress of the packaged structure is easier to control.

According to a second aspect, an embodiment of this disclosure further provides a packaged structure. The packaged structure includes a chip and the foregoing substrate. The chip includes a power terminal and a signal terminal. The chip is disposed on the first layout, the power terminal is electrically connected to the first layout, and the signal terminal is electrically connected to the second layout. Integration, heat dissipation performance, and electrical performance of the packaged structure with the substrate provided in this disclosure are effectively improved.

In some embodiments, the signal terminal is electrically connected to the second layout through a wire, or the signal terminal is electrically connected to the second layout through a solder pad. When the second substrate is mounted on the first layout of the first substrate, the signal terminal is electrically connected to the second layout through a wire. When the second substrate is embedded in the first substrate or the second substrate is connected to a side edge of the first substrate, the chip may be bonded to the first substrate and the second substrate through flip chip bonding, and the signal terminal is electrically connected to the second layout through a solder pad, thereby preventing the signal terminal from being connected to the second layout through a wire. This simplifies a manufacturing step of the packaged structure, and improves production efficiency of the packaged structure.

In some embodiments, the packaged structure includes a third substrate, the third substrate includes a third layout, a spacing between lines of the third layout is less than a spacing between lines of the first layout, and the third layout is connected between the signal terminal and the second layout. That is, the third substrate may be understood as a conversion board between the chip and the second layout, so that an electrical connection relationship between a plurality of chips and the second layout is simpler. Certainly, in another embodiment, alternatively, the chip may be directly electrically connected to the second layout.

In some embodiments, the packaged structure includes an electronic element, the electronic element is disposed on the third substrate and is electrically connected to the third layout, and the electronic element is configured to assist the third layout in a circuit change between the chip and the second layout.

According to a third aspect, an embodiment of this disclosure further provides an electronic device. The electronic device includes a circuit board and the foregoing packaged structure, and the packaged structure is electrically connected to the circuit board. Integration, heat dissipation performance, and electrical performance of an electronic device with the packaged structure provided in this disclosure are effectively improved.

The substrate in this disclosure includes the first substrate and the second substrate. The first layout (a power line) configured to be connected to the power terminal of the chip is formed on the first substrate, and the second layout (a signal line) configured to be connected to the signal terminal of the chip is formed on the second substrate, that is, the power line and the signal line are respectively disposed on two different boards. Compared with a solution in which the power line and the signal line are integrated into one board, the spacing between the lines of the second layout may be less than the spacing between the lines of the first layout, thereby facilitating miniaturization of the substrate, and further improving integration of the packaged structure, reducing production costs, and saving internal space of the electronic device.

DESCRIPTION OF EMBODIMENTS

The following describes embodiments of this disclosure with reference to accompanying drawings.

Figure 1:
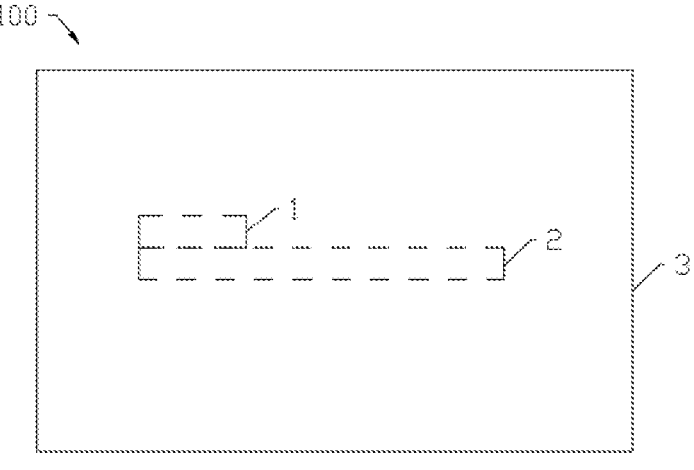
FIG. 1 is a schematic diagram of a structure of an electronic device according to an embodiment of this disclosure.

FIG. 1 is a schematic diagram of a structure of an electronic device 100 according to an embodiment of this disclosure.

The electronic device 100 includes a packaged structure 1, a circuit board 2, and a housing 3. The packaged structure 1 is mounted on the circuit board 2, and is electrically connected to the circuit board 2, to control operation of the packaged structure 1 by using the circuit board 2. Both the packaged structure 1 and the circuit board 2 are accommodated in the housing 3. The packaged structure 1 is a power module of the electronic device 100, and is configured to convert an electrical signal of the electronic device 100. The electronic device 100 in this embodiment includes but is not limited to an electronic device 100 with the packaged structure 1, such as a wind turbine, a photovoltaic generator, an electric vehicle, and a major household appliance. Integration, heat dissipation performance, and electrical performance of an electronic device 100 with the packaged structure 1 provided in this disclosure are effectively improved.

Figure 2:
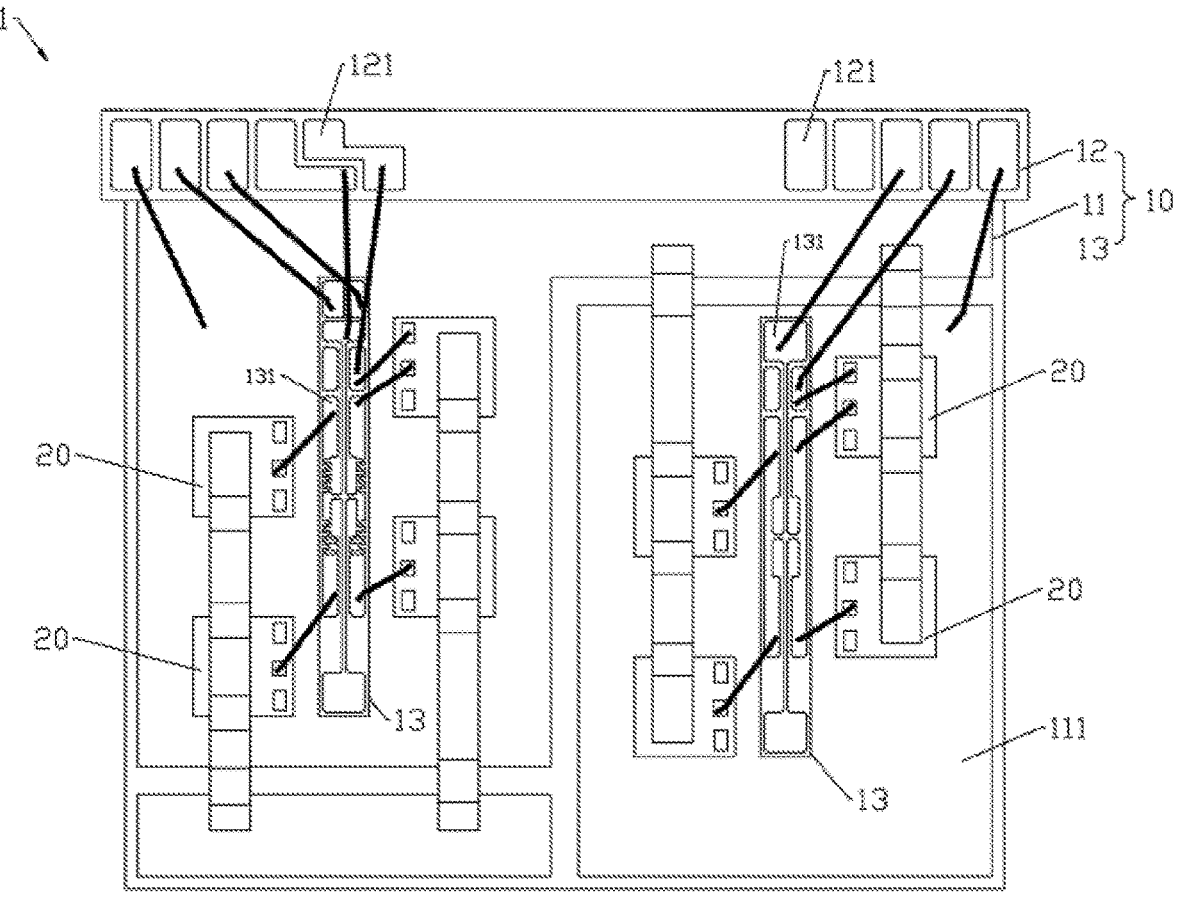
FIG. 2 is a schematic diagram of a partial structure of a packaged structure obtained by packaging a power device shown in FIG. 1.

FIG. 2 is a schematic diagram of a partial structure of the packaged structure 1 of the electronic device 100 shown in FIG. 1, where a device of the packaged structure may be a power switch device, for example, a rectifier, an inverter, or a power factor correction unit.

The packaged structure 1 includes a substrate 10 and a chip 20. The chip 20 is disposed on the substrate 10. The chip 20 includes a power terminal and a signal terminal. The power terminal is an electrode that bears a high-power high-voltage signal, for example, a collector (source) or an emitter (drain) of the chip 20. The signal terminal is an electrode that bears a low-power low-voltage signal, for example, a control gate (gate) switch of the chip 20. The power terminal of the chip 20 is electrically connected to a part of the substrate 10, and the signal terminal of the chip 20 is electrically connected to another part of the substrate 10, so that the chip 20 is electrically connected to another device through the substrate 10. In this embodiment, the packaged structure 1 includes but is not limited to various power converters such as a direct current-to-direct current converter and a direct current-to-alternating current converter. Integration, heat dissipation performance, and electrical performance of the packaged structure 1 with the substrate 10 provided in this disclosure are effectively improved.

The packaged structure 1 may further include a package body (not shown in the figure) and a heat sink (not shown in the figure). The package body is packaged on a side, of the substrate 10, on which the chip 20 is disposed, to package a device such as the chip 20 on the substrate 10. The heat sink is connected to a side, of the substrate 10, that backs the chip 20, to dissipate heat for an electronic device, such as the chip 20, packaged in the package body, and ensure electrical performance of a device such as the chip 20.

In some embodiments, some structures with a control function, for example, a control device carrying a control line, are further integrated in the package body. The control device is electrically connected to the chip 20, and may control operating of the chip 20. To ensure safety and reliability, a temperature status of the packaged structure 1 is monitored in real time. For example, a temperature sensor may be integrated in the packaged structure 1. If a temperature is excessively high or a temperature rises excessively fast, it indicates that a circuit is at risk, and a preventive action may be taken in advance, for example, a power supply is turned off.

Figure 3:
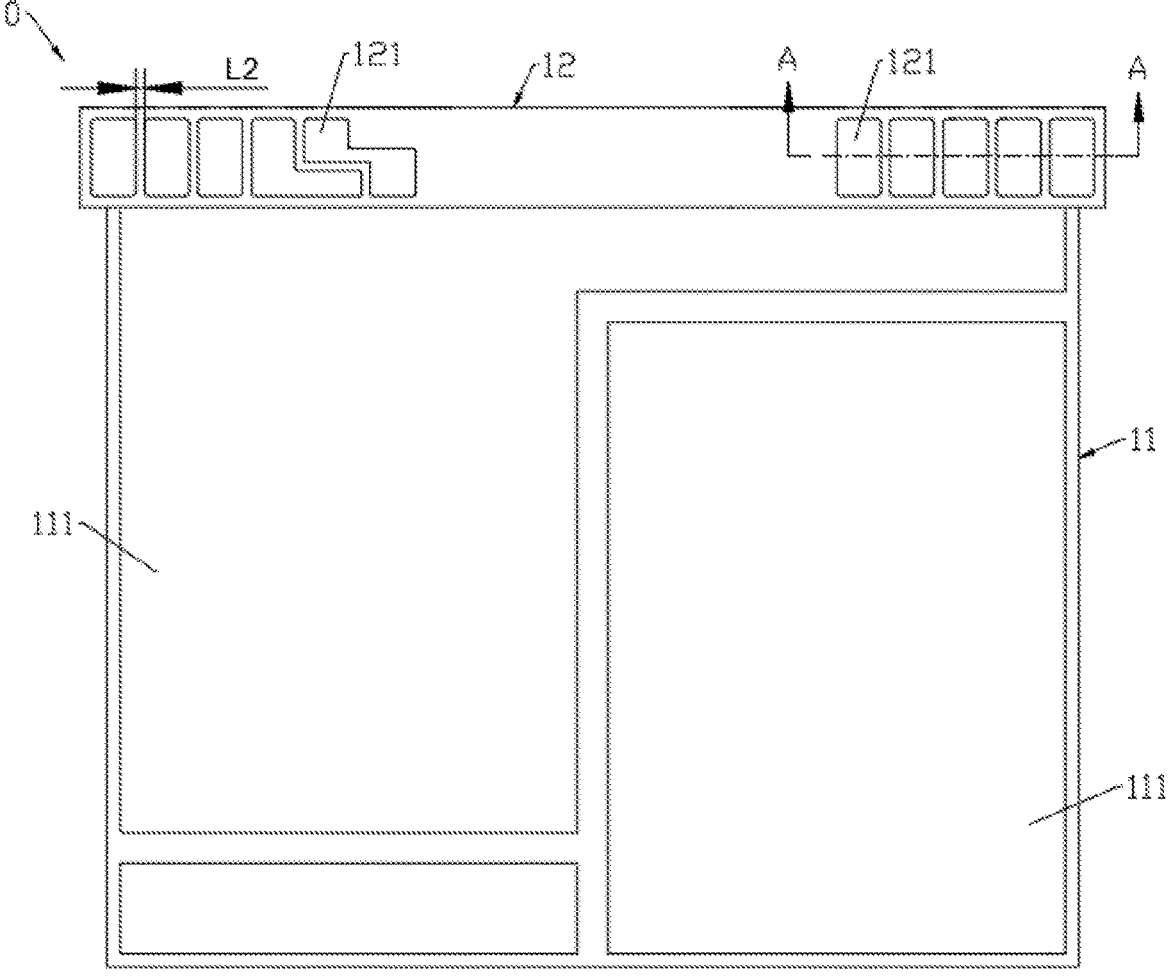
FIG. 3 is a schematic diagram of a structure of a first embodiment of a substrate of a packaged structure shown in FIG. 2.

FIG. 3 is a schematic diagram of a structure of a first embodiment of the substrate 10 of the packaged structure 1 shown in FIG. 2.

The substrate 10 includes a first substrate 11 and a second substrate 12. The second substrate 12 is mounted on the first substrate 11. The first substrate 11 includes a first layout 111. The second substrate 12 includes a second layout 121. A spacing between lines of the second layout 121 is less than a spacing between lines of the first layout 111. That is, the lines of the second layout 121 are arranged more densely than the lines of the first layout 111. The chip 20 is disposed on the first layout 111, the power terminal is electrically connected to the first layout 111, and the signal terminal is electrically connected to the second layout 121.

Figure 4:
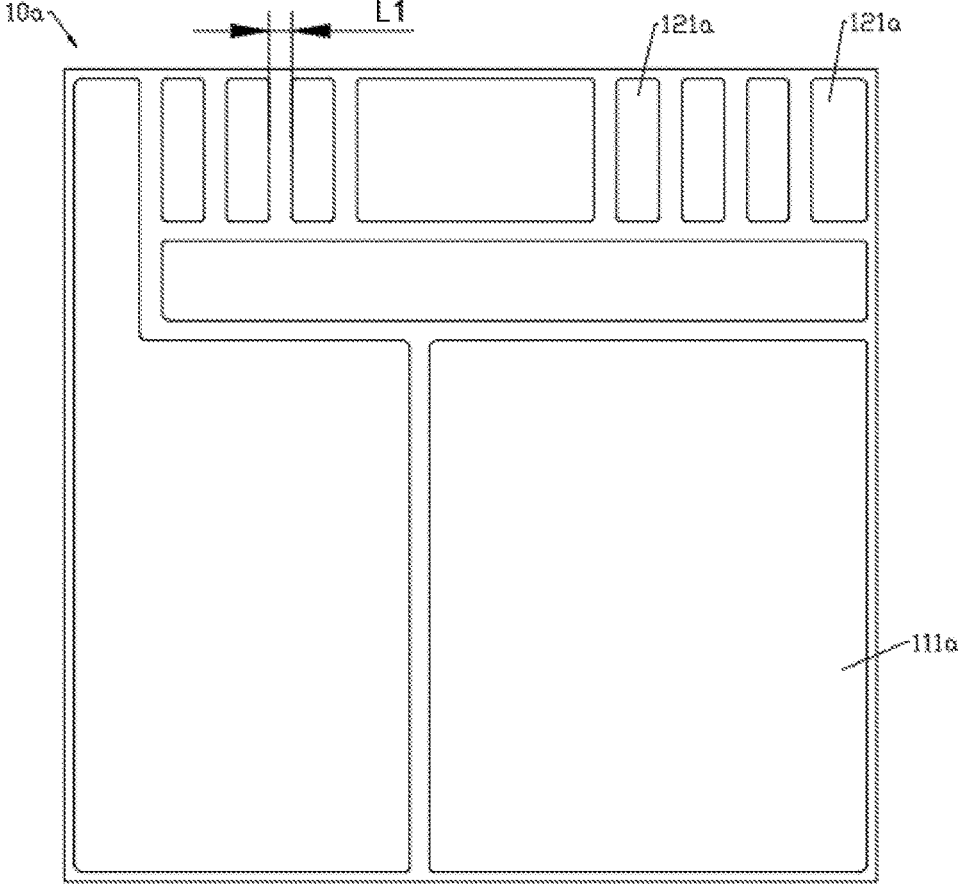
FIG. 4 is a schematic diagram of a structure of a substrate in a related technology.

It may be understood that a line on a substrate is usually formed through etching. As shown in FIG. 4, lines formed on a substrate 10a in a related technology include a power line 111a configured to be connected to a power terminal of a chip, and also include a signal line 121a configured to be connected to a signal terminal of the chip. Because a line width of the power line 111a needs to meet a requirement of a high voltage and a large current, a metal layer, on the substrate 10a, at which a line is to be formed needs to be thick. However, a thick metal layer is greatly affected by an etching process. Therefore, a width difference between the top and the bottom of a line formed through etching needs to be considered during etching of the thick metal layer. Specifically, in an etching process, a metal layer is corroded to form a groove for separating lines. During corrosion, acid starts corrosion from a surface of the metal layer. Because a side wall of a line is also corroded by a corrosive liquid, a wider region at the top of the line is corroded, and a narrower region at the bottom of the line is corroded. A difference between the top and the bottom of the formed line is in a specific proportion (a corrosion factor) to a thickness of the metal layer. A thicker metal layer indicates a larger absolute width difference between the top and the bottom of the line.

To ensure a minimum spacing at the bottom of the line and an effective width at the top of the line, during corrosion of the metal layer, a size of the metal layer needs to be relatively increased to ensure an effective area and width at the top of the line. That is, a size of the substrate 10a needs to be relatively increased to ensure an effective area and width at the top of the line. However, the signal line 121a is not subject to a requirement of a high voltage and a large current. Because the signal line 121a is also formed on a thick metal layer, a spacing L1 between lines of the signal line 121a cannot be reduced. As a result, line density of the signal line 121a is limited. This is not conducive to miniaturization of the substrate 10*a*, and is not conducive to improvement of heat dissipation efficiency of the substrate 10*a* either.

The substrate 10 includes the first substrate 11 and the second substrate 12. The first layout 111 (a power line) is configured to be connected to the power terminal of the chip 20 is formed on the first substrate 11, and the second layout 121 (a signal line) configured to be connected to the signal terminal of the chip 20 is formed on the second substrate 12, that is, the power line and the signal line are respectively disposed on two different boards. Compared with a solution in which the power line and the signal line are integrated into one board, the spacing L2 between the lines of the second layout 121 may be less than the spacing between the lines of the first layout 111, thereby facilitating miniaturization of the substrate 10, and further improving integration of the packaged structure 1, reducing production costs, and saving internal space of the electronic device 100.

In addition, the first substrate 11 is configured to be electrically connected to the power terminal of the chip 20, and further dissipates heat for the chip 20 and provides support for a device such as the chip 20. The second substrate 12 is configured to be electrically connected to the signal terminal of the chip 20, to implement an electrical connection between the chip 20 and an external lead frame or pin. The first layout 111 and the second layout 121 are respectively formed on the first substrate 11 and the second substrate 12, so that the first substrate 11 and the second substrate 12 are also distinguished in terms of functions, thereby helping optimize a functional layout of the substrate 10. In addition, the second layout 121 is not formed on the first substrate 11, thereby helping optimize distribution of the first layout 111 on the first substrate 11. Compared with forming both the first layout 111 and the second layout 121 on the first substrate 11, forming only the first layout 111 on the first substrate 11 reduces a quantity of grooves on the first substrate 11 to some extent, and correspondingly, increases a metal area of the first substrate 11, and optimizes static and dynamic heat dissipation efficiency of the packaged structure 1.

As shown in FIG. 2, in this embodiment, there are eight chips 20, and the eight chips 20 are disposed on the first layout 111 at spacings with every two chips arranged side by side. For example, the chip 20 may be a power chip such as an insulated gate bipolar transistor (IGBT), a silicon metal-oxide semiconductor field-effect transistor (MOSFET), and/or a diode, or may be another non-power chip. The silicon metal-oxide semiconductor field-effect transistor may be a silicon metal-oxide semiconductor field-effect transistor made of a silicon material, or may be a silicon metal-oxide semiconductor field-effect transistor made of a silicon carbide material or a gallium nitride material. The chip 20 may be fastened to the first layout 111 through welding, bonding, or the like. In another embodiment, a manner of disposing the chip 20 is not limited to the foregoing descriptions. Alternatively, there may be one or more, other than eight, chips 20.

Figure 5:
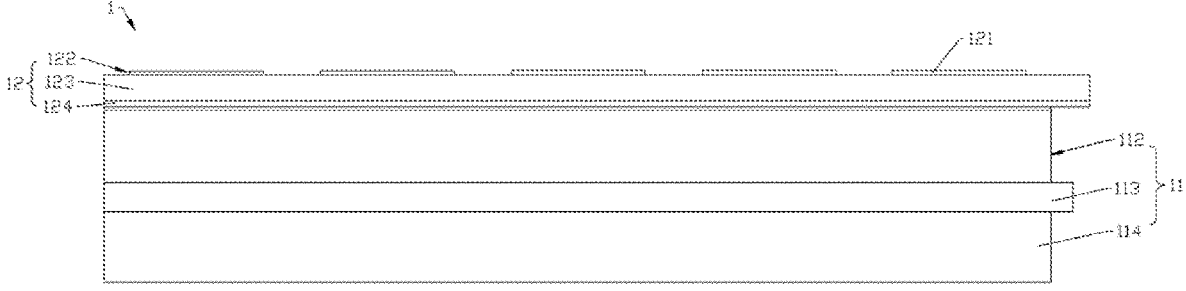
FIG. 5 is a schematic diagram of a cross-sectional structure of a substrate shown in FIG. 3 in an A-A direction.

Refer to FIG. 3 and FIG. 5. FIG. 5 is a schematic diagram of a cross-sectional structure of the substrate 10 shown in FIG. 3 in an A-A direction.

In this embodiment, the first substrate 11 includes a first metal layer 112, a bearing plate 113, and a third metal layer 114. The first metal layer 112 is disposed on the insulated and thermally conductive bearing plate 113. The third metal layer 114 is disposed on a surface, of the bearing plate 113, that backs the first metal layer 112. It may be understood that the first metal layer 112 and the third metal layer 114 are respectively disposed on two opposite surfaces of the bearing plate 113. The substrate 10 may be formed by electroplating, crimping, or welding the first metal layer 112 and the third metal layer 114 respectively on the two opposite surfaces of the bearing plate 113. The first layout 111 is formed on the first metal layer 112, that is, the third metal layer 114 is disposed on a surface, of the bearing plate 113, that backs the first layout 111, and the chip 20 (FIG. 2) is disposed on the first metal layer 112. The first layout 111 is formed on the first metal layer 112 through an etching process. Certainly, in another embodiment, the first substrate may alternatively include only a first metal layer and a bearing plate.

The first metal layer 112 is made of a copper material. Certainly, the first metal layer 112 may be alternatively made of another metal material such as aluminum or nickel. The first layout 111 is formed on the first metal layer 112 to be electrically connected to the chip 20. In addition, the first layout 111 can further dissipate heat for the chip 20, so that heat of the chip 20 is transferred the outside through the first layout 111, thereby ensuring electrical performance of the chip 20. The third metal layer 114 is made of a copper material. Certainly, the third metal layer 114 may be alternatively made of another metal material such as aluminum or nickel, or a non-metal material. The third metal layer 114 is configured to transfer, to the outside, heat transferred by the chip 20 to the first layout 111, so that heat dissipation of the chip 20 is faster, thereby ensuring electrical performance of the chip 20. In addition, the third metal layer 114 can further enhance strength of the entire substrate 10. The bearing plate 113 is made of a ceramic material. The ceramic may be, for example, a ceramic material such as aluminum oxide, silicon nitride, aluminum nitride, or reinforced aluminum nitride. The bearing plate 113 is configured to implement electrical isolation and electromagnetic shielding between the first metal layer 112 and the third metal layer 114, and reflect external electromagnetic interference, so as to prevent external electromagnetic radiation from interfering with normal operation of the chip 20, and reduce impact of interference of electromagnetic radiation in a surrounding environment on an electronic element in the packaged structure 1.

The second substrate 12 includes a second metal layer 122, an insulation plate 123, and a fourth metal layer 124. The second metal layer 122 is disposed on the insulation plate 123, and the fourth metal layer 124 is disposed on a surface, of the insulation plate 123, that backs the second metal layer 122. It may be understood that the second metal layer 122 and the fourth metal layer 124 are respectively disposed on two opposite surfaces of the insulation plate 123. The substrate 10 may be formed by electroplating, crimping, or welding the second metal layer 122 and the fourth metal layer 124 on the two opposite surfaces of the insulation plate 123. The second layout 121 is formed on the second metal layer 122, that is, the fourth metal layer 124 is disposed on a surface, of the insulation plate 123, that backs the second layout 121. The second layout 121 is formed on the second metal layer 122 through an etching process. In this embodiment, a line of the second layout 121 is a solder pad. Certainly, in another embodiment, a line of the second layout 121 may be another structure such as a wire. Alternatively, the second substrate 12 may include only an insulation plate and a second metal layer.

In this embodiment, a thickness of the second metal layer 122 is less than a thickness of the first metal layer 112, to ensure that the spacing between the lines of the second layout 121 formed on the second metal layer 122 can be less than the spacing between the lines of the first layout 111. Therefore, the lines of the second layout 121 are denser, thereby helping reduce a size of the second substrate 12, implementing miniaturization of the substrate 10, and improving integration of the packaged structure 1. Certainly, in another embodiment, the thickness of the second metal layer 122 may be greater than or equal to the thickness of the first metal layer 112, provided that the spacing between the lines of the second layout 121 formed on the second metal layer 122 is less than the spacing between the lines of the first layout 111 formed on the first metal layer 112.

Specifically, the thickness of the second metal layer 122 is 0.035 mm to 2 mm. The thickness of the second metal layer 122 is limited to 0.035 mm to 2 mm, thereby ensuring that the second metal layer 122 is sufficiently thin. Therefore, when the second layout 121 is formed on the second metal layer 122, the spacing between the lines of the second layout 121 can be sufficiently small, that is, it is ensured that the second metal layer 122 can be etched at high density, so that the lines of the second layout 121 can be denser, thereby helping reduce a size of the second substrate 12, implementing miniaturization of the substrate 10, and improving integration of the packaged structure 1. Certainly, the thickness of the second metal layer 122 may be alternatively another value beyond 0.035 mm to 2 mm.

A spacing between two adjacent lines of the lines of the second layout 121 is 0.1 mm to 0.5 mm. The spacing between two adjacent lines of the lines of the second layout 121 is limited to 0.1 mm to 0.5 mm, thereby ensuring that the spacing between the lines of the second layout 121 is sufficiently small. Therefore, it is ensured that the lines of the second layout 121 can be sufficiently dense, thereby further reducing a size of the second substrate 12, implementing miniaturization of the substrate 10, and improving integration of the packaged structure 1. Certainly, in another embodiment, the spacing between two adjacent lines of the lines of the second layout 121 may be alternatively another value, provided that it can be ensured that the lines of the second layout 121 are sufficiently dense and a size of the second substrate 12 can be further reduced.

The second substrate 12 may be a direct plating ceramic (DPC) substrate, that is, the insulation plate 123 is made of a ceramic material. A material of the ceramic may be a ceramic material such as aluminum oxide, zirconia toughened alumina ceramic, aluminum nitride, or silicon nitride. The second metal layer 122 and the fourth metal layer 124 are respectively formed on two opposite surfaces of the insulation plate 123 through copper plating. A thickness of each of the second metal layer 122 and the fourth metal layer 124 is 35 µm to 200 µm. A thickness of the second metal layer 122 may be the same as or different from that of the fourth metal layer 124. Certainly, the second metal layer 122 and the fourth metal layer 124 may be alternatively formed through a process such as electroless nickel immersion gold (ENIG), electroless nickel palladium immersion gold, bare copper, nickel plating, or gold plating.

Alternatively, the second substrate 12 may be a direct copper bonding (DCB) plate, that is, the insulation plate 123 is made of a ceramic material. A material of the ceramic may be a ceramic material such as aluminum oxide, zirconia toughened alumina ceramic, or aluminum nitride. The second metal layer 122 and the fourth metal layer 124 are respectively formed on two opposite surfaces of the insulation plate 123 through copper bonding. A thickness of each of the second metal layer 122 and the fourth metal layer 124 is 50 µm to 400 µm. A thickness of the second metal layer 122 may be the same as or different from that of the fourth metal layer 124. Certainly, the second metal layer 122 and the fourth metal layer 124 may be alternatively formed through a process such as electroless nickel immersion gold (ENIG), electroless nickel palladium immersion gold, bare copper, nickel plating, gold plating, or copper plating.

Alternatively, the second substrate 12 may be a thick film plating ceramic (TPC) plate, that is, the insulation plate 123 is made of a ceramic material. A material of the ceramic may be a ceramic material such as aluminum oxide, zirconia toughened alumina ceramic, or aluminum nitride. The second metal layer 122 and the fourth metal layer 124 are respectively formed on two opposite surfaces of the insulation plate 123 by using double-sided co-fired glass-containing metal silver paste or metal copper paste. A thickness of each of the second metal layer 122 and the fourth metal layer 124 is 35 µm to 200 µm. A thickness of the second metal layer 122 may be the same as or different from that of the fourth metal layer 124. Certainly, the second metal layer 122 and the fourth metal layer 124 may be alternatively formed through a process such as electroless nickel immersion gold (ENIG), electroless nickel palladium immersion gold, bare copper, or gold plating.

Alternatively, the second substrate 12 may be a printed circuit board (PCB), that is, the insulation plate 123 is made of a flame-resistant resin material. The second metal layer 122 and the fourth metal layer 124 are respectively formed on two opposite surfaces of the insulation plate 123 through copper plating. A thickness of each of the second metal layer 122 and the fourth metal layer 124 is 35 µm to 200 µm. A thickness of the second metal layer 122 may be the same as or different from that of the fourth metal layer 124. Certainly, the second metal layer 122 and the fourth metal layer 124 may be alternatively formed through a process such as electroless nickel immersion gold (ENIG), electroless nickel palladium immersion gold, bare copper, nickel plating, or gold plating.

The second layout 121 is formed on the second metal layer 122 to be electrically connected to the chip 20, so as to implement an electrical connection between the chip 20 and an external device. The fourth metal layer 124 is configured to transfer, to the outside, heat transferred by the chip 20 to the first layout 111, so that heat dissipation of the chip 20 is faster, thereby ensuring electrical performance of the chip 20. In addition, the fourth metal layer 124 can further implement metalized welding with the first metal layer 112. The insulation plate 123 is configured to implement electrical isolation between the second metal layer 122 and the fourth metal layer 124. In addition, the insulation plate 123 further ensures attachment and support for metal on both sides of the second substrate.

In this embodiment, the second substrate 12 is mounted on the first layout 111 of the first substrate 11, and a side, of the insulation plate 123, that backs the second layout 121 is connected to a surface of the first layout 111. Specifically, the fourth metal layer 124 on the side, of the insulation plate 123, that backs the second layout 121 is disposed on the surface of the first layout 111, that is, the fourth metal layer 124 is disposed on the surface of the first metal layer 112. The fourth metal layer 124 is fastened to the first metal layer 112 through solder reflow, laser welding, or ultrasonic welding, and is spaced from the chip 20. The second substrate 12 is mounted on the first substrate 11, thereby helping reduce a planar area of the entire substrate 10, and improving integration of the substrate 10 and the packaged structure 1. Certainly, in another embodiment, the fourth metal layer may be alternatively fastened to the first metal layer 112 in another connection manner such as bonding or clamping. Alternatively, the insulation plate 123 may be directly fastened to the first metal layer 112.

Figure 6:
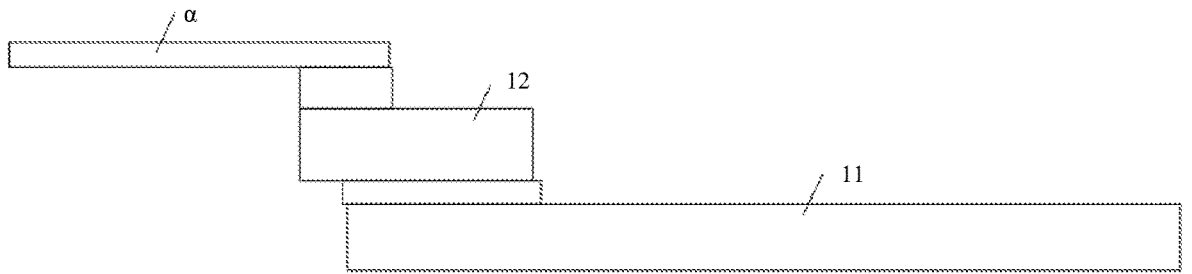
FIG. 6 is a schematic diagram of a structure of a combination of a substrate shown in FIG. 2 and a lead frame.

Refer to FIG. 2 and FIG. 6. FIG. 6 is a schematic diagram of a structure between the substrate 10 shown in FIG. 2 and a lead frame.

The signal terminal of the chip 20 is electrically connected to the second layout 121 through a wire, the wire is fastened to the second layout 121 through ultrasonic bonding or welding, and the second substrate 12 is mounted at an edge of the first metal layer 112, so that the signal terminal is electrically connected to an external device through the second layout 121 of the second substrate 12. One end of the lead frame a is electrically connected to the second layout 121, and the other end is electrically connected to an external device, to implement an electrical connection between the chip 20 and the external device. The lead frame a may be welded on the second layout 121 through solder reflow, laser welding, ultrasonic welding, or the like. Some pins of the lead frame a may further carry temperature-sensitive resistors, to provide over-temperature protection for the packaged structure 1. A width of the second substrate 12 may be greater than, less than, or equal to a width of the first substrate 11. Certainly, in another embodiment, a wireless bonding process may be alternatively used. For example, a copper sheet is used to replace a wire to connect the signal terminal and the second layout 121, to transmit a current. This greatly reduces internal resistance of the packaged structure 1, and costs are not high.

As shown in FIG. 2, the packaged structure 1 further includes a third substrate 13, the third substrate 13 includes a third layout 131, and the third layout 131 is connected between the signal terminal and the second layout 121. That is, the third substrate 13 may be understood as a conversion board between the chip 20 and the second layout 121, so that an electrical connection relationship between a plurality of chips 20 and the second layout 121 is simpler. Certainly, in another embodiment, alternatively, the chip 20 may be directly electrically connected to the second layout 121.

In this embodiment, there are two third substrates 13. The two third substrates 13 are disposed on the first layout 111 at an interval, and each are located between two adjacent columns of chips 20. A signal terminal of each chip 20 is electrically connected to a third layout 131 of a third substrate 13 close to the signal terminal, and the third layout 131 is electrically connected to the second layout 121, to implement conversion between the chip 20 and the second layout 121. Specifically, a signal terminal of a chip 20 is electrically connected to a third layout 131 close to the signal terminal through a wire, and one end, of the third layout 131, that is close to the second substrate 12 is electrically connected to the second layout 121 through a wire. The third substrate 13 is used to implement conversion between a chip 20 close to the third substrate 13 and the second layout 121. Compared with a manner in which each chip 20 is separately connected to the second layout 121 through a wire, a manner in which all chips 20 are aggregated by using the third substrate 13 and then electrically connected to the second layout 121 is simpler and neater, and a length of a wire is also shortened. Certainly, in another embodiment, there may be one or more third substrates 13, and an arrangement manner of the third substrates 13 may be further set according to an actual requirement.

A spacing between lines of the third layout 131 is less than the spacing between the lines of the first layout 111, that is, the spacing between the lines of the third layout 131 can be arranged to be less than the spacing between the lines of the first layout 111. This facilitates miniaturization of the third substrate 13, and further improves integration of the packaged structure 1. Certainly, in another embodiment, the spacing between the lines of the third layout 131 may be alternatively greater than or equal to the spacing between the lines of the first layout 111.

The packaged structure 1 includes an electronic element, and the electronic element is disposed on the third substrate 13 and is electrically connected to the third layout 131. Specifically, for example, the electronic element is a passive element such as a resistor or a capacitor. The electronic element is configured to assist the third layout 131 in a circuit change between the chip 20 and the second layout 121.

Figure 7:
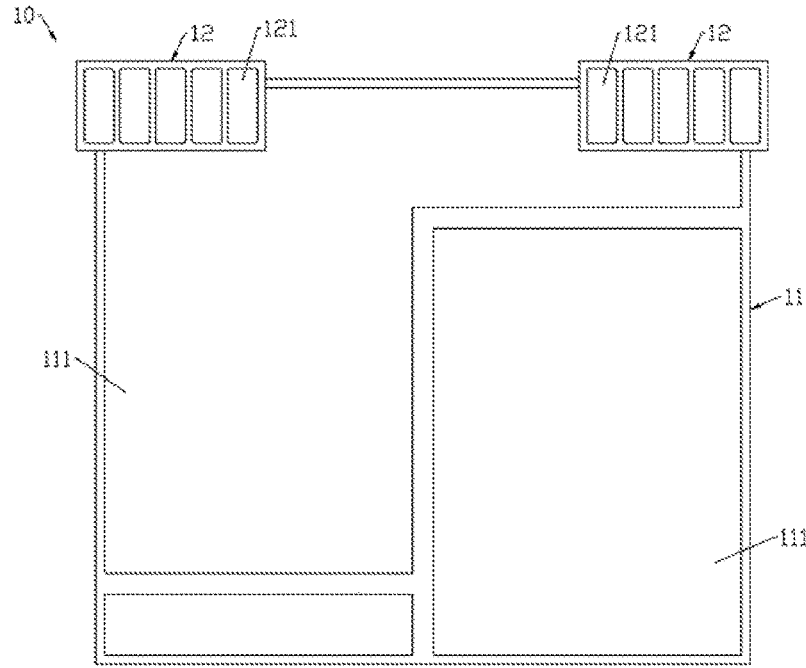
FIG. 7 is a diagram of a structure of a second embodiment of a substrate shown in FIG. 3.

FIG. 7 is a diagram of a structure of a second embodiment of the substrate 10 shown in FIG. 3.

This embodiment is approximately the same as the first embodiment. A difference lies in that there are two second substrates 12 in this embodiment, and the two second substrates 12 are mounted on the first substrate 11 at an interval. One second substrate 12 is correspondingly connected to one third substrate. The two second substrates 12 are respectively disposed close to chips 20 electrically connected to the two second substrates 12. Here, two second substrates 12 are included. This is equivalent to separately disposing, on two boards, the second layout 121 disposed on one board, so that the second substrate 12 can be made smaller. In addition, the two second substrates 12 may be separately disposed at different locations based on chips 20 electrically connected to the two second substrates 12, so that a layout is more flexible, and stress of the packaged structure 1 is easier to control. Certainly, in another embodiment, there may be alternatively a plurality of second substrates 12, and the plurality of second substrates 12 are mounted on the first substrate 11 at spacings.

Figure 8:
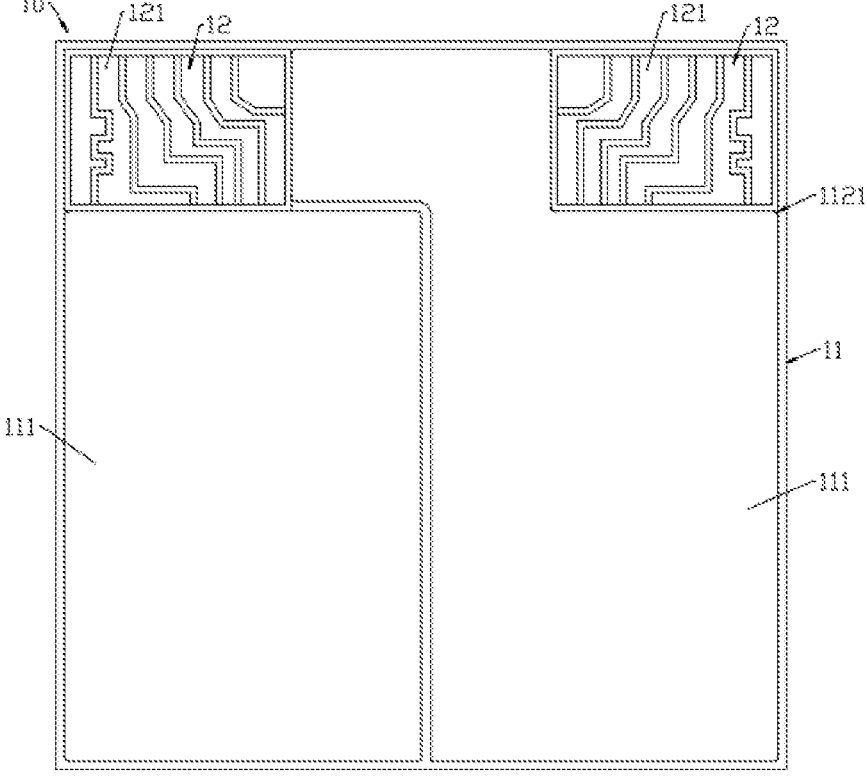
FIG. 8 is a diagram of a structure of a third embodiment of a substrate shown in FIG. 3.
Figure 9:
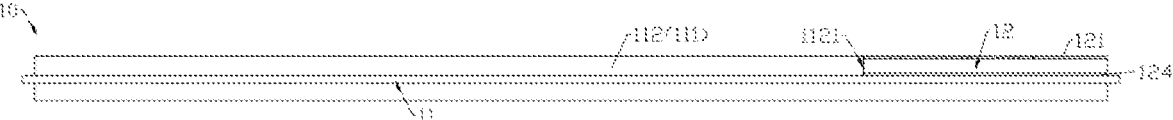
FIG. 9 is a schematic diagram of a cross-sectional structure of a substrate shown in FIG. 8.

FIG. 8 is a diagram of a structure of a third embodiment of the substrate 10 shown in FIG. 3, and FIG. 9 is a schematic diagram of a cross-sectional structure of the substrate 10 shown in FIG. 8.

This embodiment is approximately the same as the first embodiment. A difference lies in that the first metal layer 112 in this embodiment includes an avoidance groove 1121, and the second substrate 12 is completely embedded in the avoidance groove 1121. Specifically, the fourth metal layer 124 of the second substrate 12 is welded to a bottom wall of the avoidance groove 1121, and the second layout 121 of the second substrate 12 is insulated from the first metal layer 112. That is, in this embodiment, the second substrate 12 is embedded in the first substrate 11, thereby further improving integration of the substrate 10 while reducing a planar size of the substrate 10, without increasing a size of the substrate 10 in a thickness direction. Certainly, in another embodiment, alternatively, the second substrate 12 may be at least partially embedded in the avoidance groove 1121, and the fourth metal layer 124 of the second substrate 12 may be further fastened to the avoidance groove 1121 through bonding or clamping. Alternatively, the third substrate may be embedded in the first metal layer.

Figure 10:
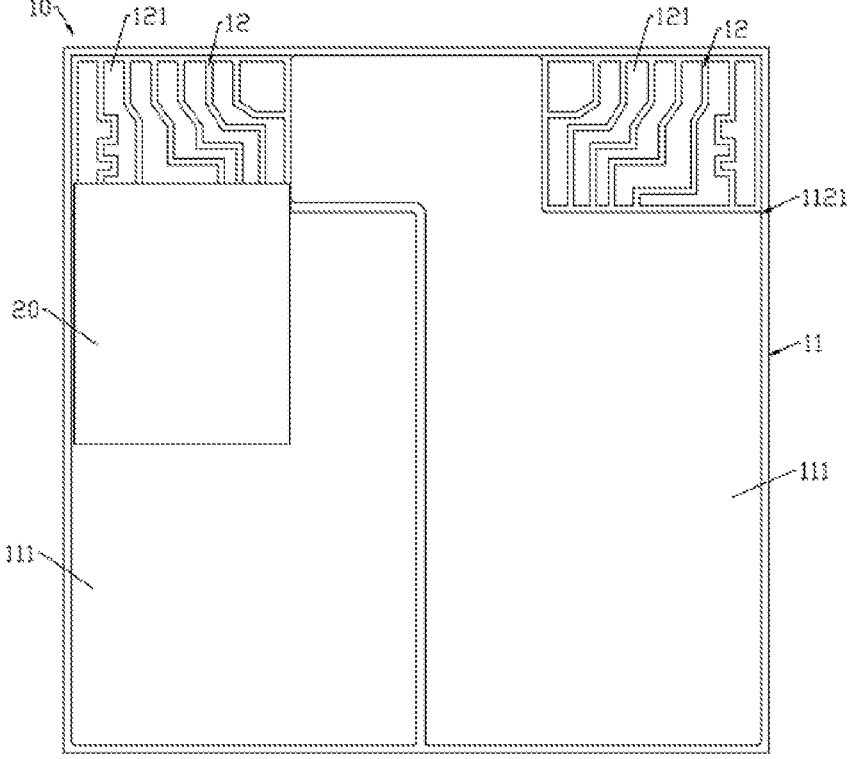
FIG. 10 is a schematic diagram of a structure of a combination of a substrate shown in FIG. 8 and a chip.
Figure 11:
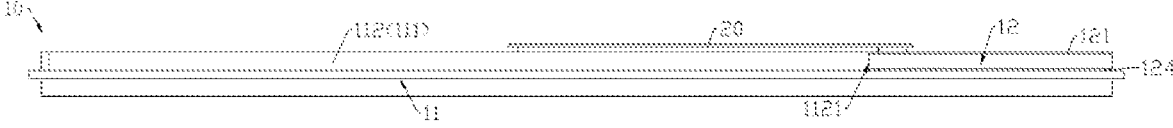
FIG. 11 is a schematic diagram of a cross-sectional structure of a substrate shown in FIG. 10.

In this embodiment, there are two second substrates 12. Correspondingly, there are also two avoidance grooves 1121, and each substrate 12 is embedded in a corresponding avoidance groove 1121. A line of the second layout 121 is a wire, and a surface, of the second layout 121, that faces an opening of the avoidance groove 1121 is flush with the opening. The second layout 121 is flush with a surface, of the first layout 111, that backs the bearing plate 113, so that the chip 20 can be bonded to the substrate 10 through flip chip bonding. As shown in FIG. 10 and FIG. 11, a part, of the chip 20, that has the power terminal may be disposed on the first substrate 11 and electrically connected to the first layout 111, and a part, of the chip 20, that has the signal terminal is disposed on the second substrate 12 and electrically connected to the second layout 121. Specifically, the power terminal is welded to the first layout 111 through a solder pad, and the signal terminal is also welded to the second layout 121 through a solder pad, thereby preventing the signal terminal from being connected to the second layout 121 through a wire. This simplifies a manufacturing step of the packaged structure 1 (FIG. 2), and improves production efficiency of the packaged structure 1. Certainly, in another embodiment, a line of the second layout 121 may be alternatively another structure such as a solder pad. Alternatively, there are one or more second substrates 12 and one or more avoidance grooves 1121, and the second substrates are respectively embedded in corresponding avoidance grooves at spacings. Alternatively, all chips are disposed on the first layout, and the chips are electrically connected to the second substrate through wires.

Figure 12:
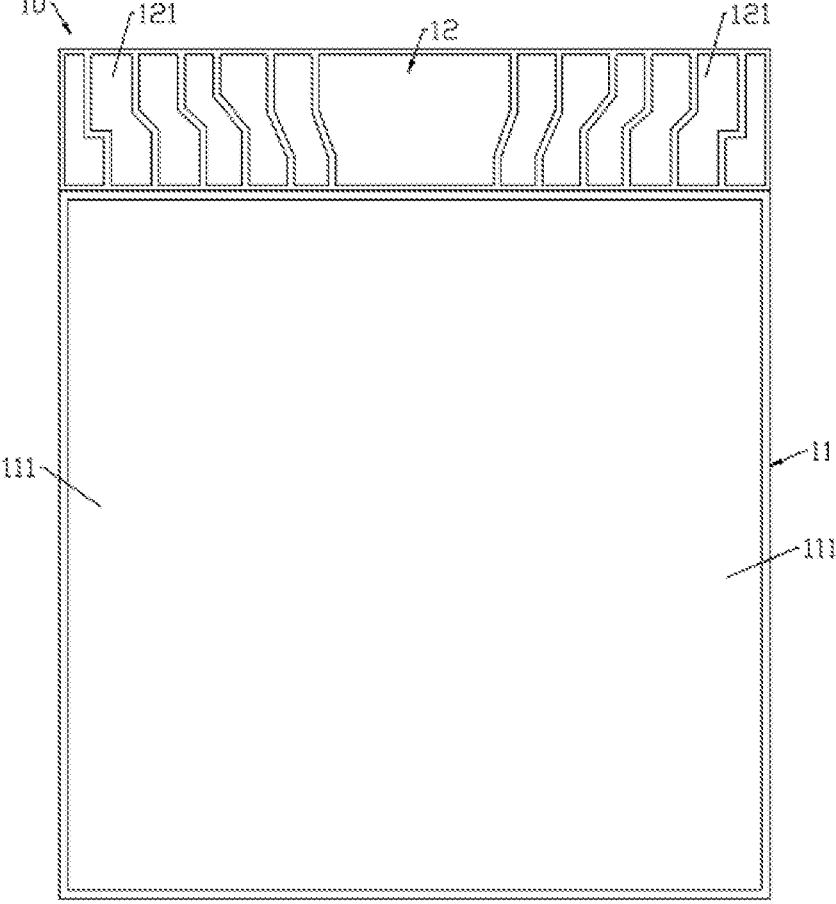
FIG. 12 is a diagram of a structure of a fourth embodiment of a substrate shown in FIG. 3.
Figure 13:
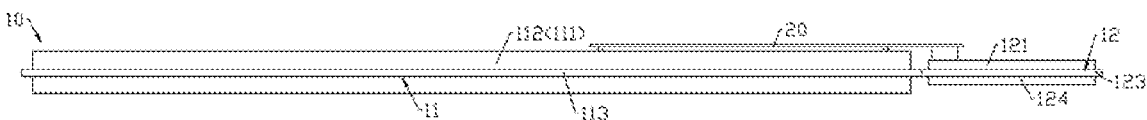
FIG. 13 is a schematic diagram of a cross-sectional structure of a substrate shown in FIG. 12.

FIG. 12 is a diagram of a structure of a fourth embodiment of the substrate 10 shown in FIG. 3, and FIG. 13 is a schematic diagram of a cross-sectional structure of the substrate 10 shown in FIG. 12.

This embodiment is approximately the same as the first embodiment. A difference lies in that a side edge of the insulation plate 123 is connected to a side edge of the bearing plate 113 in this embodiment, and the first layout 111 is spaced from the second layout 121. Specifically, the insulation plate 123 and the bearing plate 113 are spliced through high-energy laser or in another manner. Compared with the first embodiment in which the second substrate 12 is welded to a surface of the first metal layer 112, an area of a solder side on which the side edge of the insulation plate 123 is connected to the side edge of the bearing plate 113 is smaller, and corresponding process costs are reduced. In addition, the insulation plate 123 can be welded to any side edge of the bearing plate 113, so that a design is more flexible. Certainly, in another embodiment, the second substrate 12 may be alternatively mounted on the first substrate 11 in another connection manner.

In a scenario of this embodiment, a line of the second layout 121 is a wire, the first layout 111 of the first substrate 11 and the second layout 121 of the second substrate 12 face a same direction, and the chip 20 may be directly bonded to the substrate 10 through flip chip bonding. A part, of the chip 20, that has the power terminal may be disposed on the first substrate 11 and electrically connected to the first layout 111, and a part, of the chip 20, that has the signal terminal is disposed on the second substrate 12 and electrically connected to the second layout 121. Specifically, the power terminal is welded to the first layout 111, and the signal terminal is also welded to the second layout 121, thereby preventing the signal terminal from being connected to the second layout 121 through a wire. This simplifies a manufacturing step of the packaged structure 1 (FIG. 2), and improves production efficiency of the packaged structure 1. Certainly, in another embodiment, a line of the second layout 121 may be alternatively another structure such as a solder pad. Alternatively, there are a plurality of second substrates, and the plurality of second substrates are connected to any side edge of the first substrate at spacings, or the plurality of second substrates are separately disposed at different side edges of the first substrate. Alternatively, all chips are disposed on the first layout, and the chips are electrically connected to the second substrate through wires.

The protection scope of this application is not limited to the first embodiment to the fourth embodiment, and any combination of the first embodiment to the fourth embodiment also falls within the protection scope of this application. That is, the foregoing plurality of embodiments may be alternatively combined according to an actual requirement.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A device, comprising:
a chip that includes a power terminal and a signal terminal;
a first substrate comprising a first layout, the first layout coupled to the power terminal;
a second substrate comprising a second layout, the second layout coupled to the signal terminal, the second substrate mounted on the first substrate;
wherein a spacing between lines of the second layout is less than a spacing between lines of the first layout; and
wherein the first substrate comprises a first metal layer, the first layout is formed on the first metal layer, the second substrate comprises a second metal layer, the second layout is formed on the second metal layer, and a thickness of the second metal layer is less than a thickness of the first metal layer.

2. The device according to claim 1, wherein the thickness of the second metal layer is 0.035 mm to 2 mm.

3. The device according to claim 1, wherein a spacing between two adjacent lines of the lines of the second layout is 0.1 mm to 0.5 mm.

4. The device according to claim 1, wherein the first metal layer comprises an avoidance groove, and the second substrate is at least partially embedded in the avoidance groove.

5. The device according to claim 4, wherein the first substrate comprises a bearing plate, the first metal layer is disposed on the bearing plate, and a surface, of the second layout, that backs the bearing plate is flush with a surface, of the first metal layer, that backs the bearing plate.

6. The device according to claim 1, wherein the second substrate further comprises an insulation plate, the second layout is disposed on the insulation plate, and a side, of the insulation plate, that backs the second layout is connected to a surface of the first layout.

7. The device according to claim 6, wherein the second substrate further comprises a fourth metal layer, and the fourth metal layer is disposed on a surface, of the insulation plate, that backs the second layout.

8. The device according to claim 1, wherein the second substrate comprises an insulation plate, the second layout is disposed on the insulation plate, the first substrate comprises a bearing plate, the first layout is disposed on the bearing plate, a side edge of the insulation plate is connected to a side edge of the bearing plate, and the first layout is spaced from the second layout.

9. The device according to claim 8, wherein the first substrate further comprises a third metal layer, and the third metal layer is disposed on a surface, of the bearing plate, that backs the first layout.

10. The device according to claim 1, wherein there are a plurality of second substrates, and the plurality of second substrates are mounted on the first substrate at spacings, and are respectively disposed close to the chip electrically coupled to the plurality of second substrates.

11. A packaged structure, comprising:

a chip that includes a power terminal and a signal terminal;

a first substrate comprising a first layout, the first layout coupled to the power terminal;

a second substrate comprising a second layout, the second layout coupled to the signal terminal, the second substrate mounted on the first substrate; and wherein:

a spacing between lines of the second layout is less than a spacing between lines of the first layout;

the chip is disposed on the first layout; and wherein the packaged structure comprises a third substrate, the third substrate comprises a third layout, a spacing between lines of the third layout is less than a spacing between lines of the first layout, and the third layout is coupled between the signal terminal and the second layout.

12. The packaged structure according to claim 11, wherein the signal terminal is electrically coupled to the second layout through a wire, or the signal terminal is electrically coupled to the second layout through a solder pad.

13. The packaged structure according to claim 11, wherein the packaged structure comprises an electronic element, and the electronic element is disposed on the third substrate and is electrically coupled to the third layout.

14. An electronic device, comprising:

a chip that includes a power terminal and a signal terminal;

a first substrate comprising a first layout, the first layout coupled to the power terminal;

a second substrate comprising a second layout, the second layout coupled to the signal, the second substrate mounted on the first substrate; and wherein:

a spacing between lines of the second layout is less than a spacing between lines of the first layout;

the chip is disposed on the first layout; and wherein the electronic device comprises a circuit board and a packaged structure that is electrically coupled to the circuit board; and wherein the packaged structure comprises a third substrate, the third substrate comprises a third layout, a spacing between lines of the third layout is less than a spacing between lines of the first layout, and the third layout is coupled between the signal terminal and the second layout.

* * * * *